United States Patent [19]
Wang

[11] Patent Number: 5,849,637
[45] Date of Patent: Dec. 15, 1998

[54] INTEGRATION OF SPIN-ON GAP FILLING DIELECTRIC WITH W-PLUG WITHOUT OUTGASSING

[76] Inventor: Chin-Kun Wang, #16, Lane 129, Chung-Chen South Rd., San-Chung, Taipei, Taiwan

[21] Appl. No.: 662,774

[22] Filed: Jun. 10, 1996

[51] Int. Cl.⁶ ............................................. H01L 21/306
[52] U.S. Cl. .................. 438/699; 438/631; 438/633; 438/634; 438/639; 438/692; 438/697; 438/700; 438/702
[58] Field of Search ..................... 438/631, 692, 438/697, 699, 700, 702, 639, 633, 634

[56] References Cited

U.S. PATENT DOCUMENTS

| | | | |
|---|---|---|---|
| 4,095,330 | 6/1978 | Kim | 438/412 |
| 4,676,867 | 6/1987 | Elkins et al. | 438/699 |
| 4,705,596 | 11/1987 | Gimpelson et al. | 438/697 |
| 4,708,767 | 11/1987 | Bril | 438/631 |
| 5,084,407 | 1/1992 | Boland et al. | 438/400 |
| 5,298,463 | 3/1994 | Sandhu et al. | 438/620 |
| 5,302,551 | 4/1994 | Iranmanesh et al. | 438/633 |
| 5,312,512 | 5/1994 | Allman et al. | 438/624 |
| 5,378,318 | 1/1995 | Weling et al. | 438/697 |
| 5,399,533 | 3/1995 | Pramanik et al. | 438/624 |
| 5,437,763 | 8/1995 | Huang | 438/624 |
| 5,449,314 | 9/1995 | Meikle et al. | 438/692 |
| 5,449,644 | 9/1995 | Hong et al. | 438/632 |
| 5,459,096 | 10/1995 | Venkatesan et al. | 438/437 |
| 5,496,774 | 3/1996 | Pramanik et al. | 438/624 |
| 5,496,776 | 3/1996 | Chien et al. | 438/624 |
| 5,631,197 | 5/1997 | Yu et al. | 438/699 |
| 5,654,238 | 8/1997 | Cronin et al. | 438/700 |
| 5,663,107 | 9/1997 | Peschke et al. | 438/692 |
| 5,665,657 | 9/1997 | Lee | 438/624 |

OTHER PUBLICATIONS

M. Hamanaka, S. Dohmae, K. Fujiwara, M. Shishino and S. Mayumi, *Via Failures Due to Water Emission from SOG*, 1994 IEEE/IRPS (No Month).

*Primary Examiner*—Anthony J. Green
*Attorney, Agent, or Firm*—Proskauer Rose LLP

[57] ABSTRACT

A via hole for a metal contact is formed by depositing a metal layer on the surface of a semiconductor device structure; depositing a thick PECVD oxide on the metal layer; patterning the metal layer using photolithography and etching so that what remains after this step is patterned metal regions such as lines or pads, each of which metal regions is covered by a thick PECVD oxide; creating islands of PECVD oxide using a photolithography process on the patterned metal regions at locations where it is desired to form via holes, the remainder of the patterned metal regions being covered with a thin PECVD oxide under layer; depositing a spin-on planarization material, such as SOG or low K polymer resulting in only a thin layer of spin-on material on top of the islands; using a partial etchback, removing the SOG from the top of the islands; depositing a PECVD oxide capping layer and polishing the capping layer using CMP; and then forming the via holes in the PECVD islands. The result is a via hole whose side walls are covered with a high quality PECVD oxide. Thereafter, the via hole can be filled with a W-plug without a problem of outgassing from a spin-on material such as SOG or low K polymer.

8 Claims, 6 Drawing Sheets

INTEGRATION OF SPIN-ON GAP FILLING DIELECTRIC WITH W-PLUG WITHOUT OUTGASSING

FIELD OF THE INVENTION

The present invention relates to a technique for forming an integrated circuit structure in which spin-on-glass (SOG) or low "K" polymer (where low K means <3.0) is used for planarization and in which a W-plug (tungsten plug) is used for making a metal contact. According to the inventive process, a via hole in which the W-plug is to be formed has sidewalls which are sealed with high quality oxide. This prevents outgassing of SOG or low K polymer during formation of the W-plug.

BACKGROUND OF THE INVENTION

Using multi-layers of metals in VLSI technology can significantly reduce die size and increase device performance. A good planarization technology is important to realize reliable sub-micron multilevel metallization.

Compared to other planarization technologies, the spin-on approach has significant advantages. Because of the liquid nature, the SOG process is relatively simple, economical and is capable of high throughput. It can fill narrow spaces without causing voids (see e.g., Hamanaka et al., "Via Failures Due To Water Emission From SOG" IEEE/IRPS Conference 1994).

As devices continuously shrink to deep sub-half-micron regimes, the requirements of multilevel interconnect technology becomes more stringent. A significant increase in aspect ratio (i.e. ratio of hole depth to hole width) for smaller contacts and via holes strongly challenges the traditional PVD (Physical Vapor Deposition) metallization process. Therefore, the W-plug process becomes more attractive in multilevel interconnect applications. Among various planarization schemes, the spin-on-glass (SOG) process is very popular due to its good gap filling and planarization performances, and low "k" polymer is another approach which offers reduced interconnect capacitances due to the low dielectric constant (<3).

When exposed to the environment, these spin-on gap filling dielectric materials typically absorb high concentrations of moisture which can be partially released during a high temperature process (e.g., greater than 400° C.) such as during WCVD (tungsten chemical vapor deposition) through a via or contact opening. This phenomena is called "outgassing". Such outgassing is known in the IC industry to cause physical/electrical reliability issues such as unstable contact/via resistance. See H. Hamanaka, S. Dohmae, K. Fujiwara, M. Shishino and S. Mayumi, Via Failures Due to Water Emission fom SOG, 1994 IEEE/IRPS Conference p. 405, col. 2, line 13. One major difficultly is to integrate W-plug with a spin-on gap filling material. Another issue is that it is hard to remove SOG or low K polymer atop a metal layer by a partial etch back process due to a large amount of SOG or low K polymer that remains at wide metal lines or metal pads. This is characteristic of a spin-on process.

FIG. 1 illustrates an integrated circuit structure in which a conventional spin-on planarization material (SOG or low "k" polymer) is utilized.

The structure 10 is formed on a silicon substrate not shown. The structure has an Inter-Layer Dielectric (ILD) 12. Below the ILD are various regions of various materials such as polysilicon regions 18, and field oxide (FOX) region 19. It is the structures above the ILD 12 which are important to the present invention.

A metal-1 layer (M-1) is deposited on the ILD 12. The metal-1 layer is patterned using photolithography and etching to form the M-1 regions 20, 22, 24. A PECVD oxide underlayer 30 is deposited to cover the M-1 regions 20, 22, 24 and the exposed portions of the ILD 12. A gap filling spin-on material 32 (SOG or low "k" polymer) is then spun on and partially etched back. A PECVD oxide capping layer 34 is then formed over the partially etched back spin-on material 32. After this, photolithograpy and etching are used to etch the via holes 36, 37, 38.

In some cases, the planarization process (spin-on gap filling material and partial etchback) results in a satisfactory vias, e.g., vias 36 and 37, wherein there is no SOG or low K polymer exposed at the sidewalls of the via. In contrast, there is spin-on material 32 exposed at the sidewalls of the via hole 38 despite the partial etchback of the spin-on material. The spin-on material is generally exposed at the sidewall of a via formed over a large metal region or other "completely flat region". The problem resulting from exposed spin-on material at the sidewall of a via may be understood in connection with FIG. 2.

FIG. 2 shows the via hole 38. FIG. 2 also shows the M-1 metal 24, the PECVD oxide underlayer 30, the SOG of low K polymer 32, and the oxide capping layer 34. Before the tungsten plug is deposited, a TiN barrier layer 40 is deposited on the walls of the via hole 38. The filling of the via hole 38, is a competition between diffusion of $WF_6$ (the W source gas) and outgassing of the SOG or low K polymer. Specifically, as shown in FIG. 2, $C_0$ indicates the initial concentration of $WF_6$ gas and $C_1$ indicates the concentration of $WF_6$ gas inside the via hole 38. If $C_0 > C_1$, $WF_6$ will diffuse into the via hole 38. If there is substantial outgassing from the spin-on material 32, W cannot effectively fill the via hole 38 and severe volcano-type defects will arise. The electrical and reliability performance of the W via plug will be seriously degraded.

In view of the foregoing, it is an object of the invention to provide a process for forming a via hole for a tungsten (W)-plug metal contact in which there is no outgassing from a spin-on material such as SOG or low K polymer.

SUMMARY OF THE INVENTION

In accordance with the invention, a via hole for a metal contact is formed by (1) depositing a metal layer on the surface of a semiconductor device structure, (2) depositing a thick PECVD oxide on the metal layer with a thickness of, for example, 3000–5000 Angstroms, (3) patterning the metal layer using photolithography and etching. This is accomplished by using a first photoresist mask and first etching step to pattern the oxide and then using the patterned oxide as a mask and a second etching step to pattern the metal. What remains at after this step is patterned metal regions such as lines or pads, each of which metal regions is covered by a thick PECVD oxide, (4) create islands of PECVD oxide using a photolithography process on the patterned metal regions at locations where it is desired to form via holes, the remainder of the patterned metal regions being covered with a PECVD oxide under layer, (5) deposit a spin-on planarization material such as SOG or low K polymer; the spin-on process resulting in only thin layer of spin-on material on top of the islands.

(6) using a partial etchback, remove the SOG from the top of the islands (7) deposit a PECVD oxide capping layer and polish the capping layer using CMP (chemical-mechanical polishing)

(8) form the via holes in the PECVD islands.

The result is a via hole whose side walls are covered with high quality PECVD oxide. Thus, the via hole can be filled with a W-plug without a problem of outgassing from a spin-on material such as SOG or low K polymer.

DETAILED DESCRIPTION OF THE INVENTION

Figure 1:
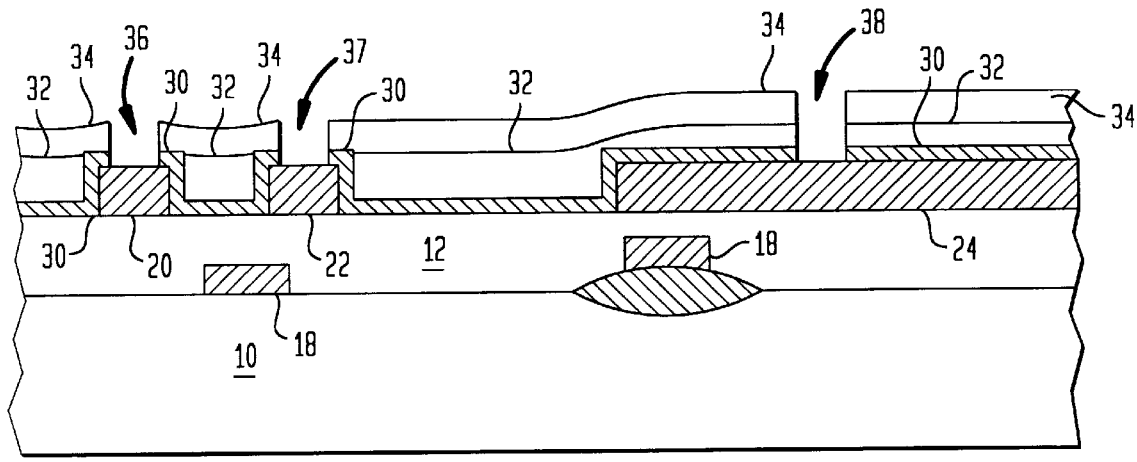
FIG. 1 schematically illustrates a via hole formed in accordance with a conventional process.
Figure 2:
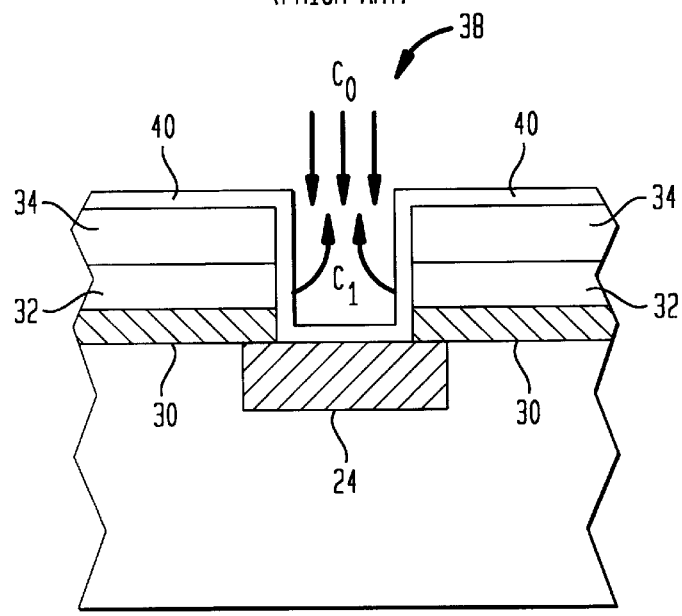
FIG. 2 illustrates how outgassing from SOG results in a poor quality W-plug in a via hole formed in accordance with the conventional process.
Figure 3:
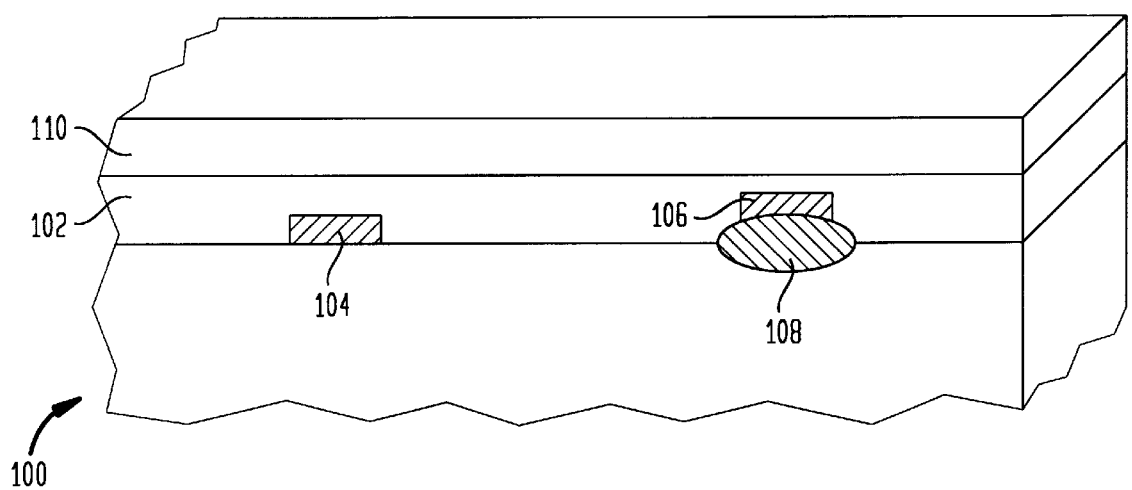
FIGS. 3, 4, 5, 6, 7, and 8 are perspective views illustrating a portion of a process for forming a via hole in accordance with an illustrative embodiment of the invention.

FIG. 3 illustrates an integrated circuit structure 100. Illustratively, the structure 100 is formed on a silicon substrate which is not shown in FIG. 3. The structure 100 has an Inter-Layer Dielectric (ILD) 102. Below the ILD are regions of various materials such as polysilicon regions 104, 106 and field oxide (FOX) regions 108. It is the structure to be formed above the ILD 108 which is important for the present invention.

A metal layer 110 (also designated metal-1 or M-1) is deposited on top of the ILD. Illustratively, the metal which is deposited is AlSiCu or AlCu material. The metal layer 110 has a thickness of 4000~8000 Å and is deposited using a PVD (physical vapor deposition) process.

Figure 4:
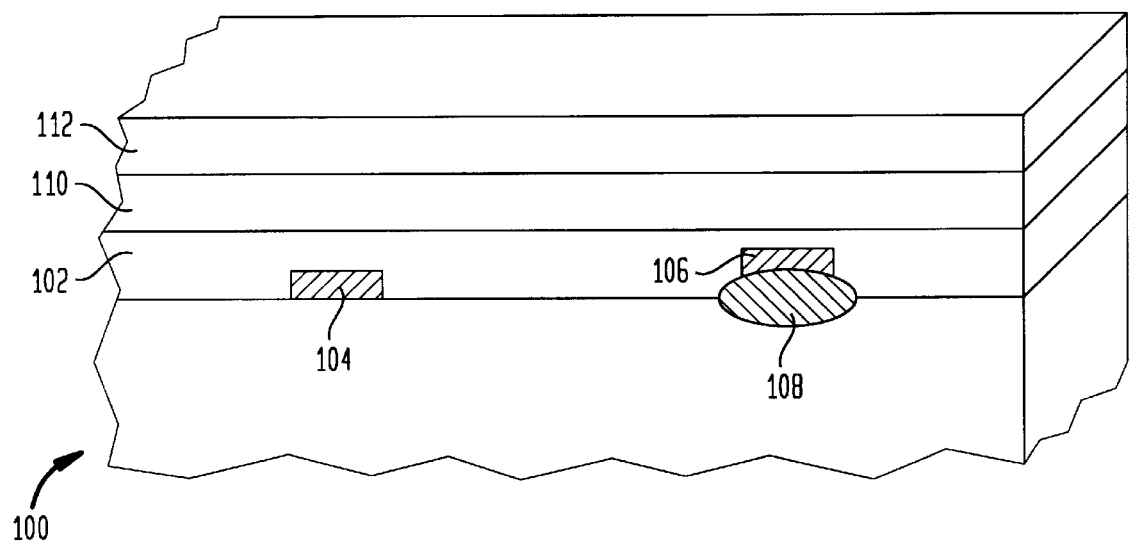

As shown in FIG. 4, a thick layer of oxide 112 is formed on the metal layer 110. The oxide layer 112 is formed using a PECVD (Plasma Enhanced Chemical Vapor Deposition) process. The oxide layer 112 has a thickness of 3000 Å–5000 Å.

Figure 5:
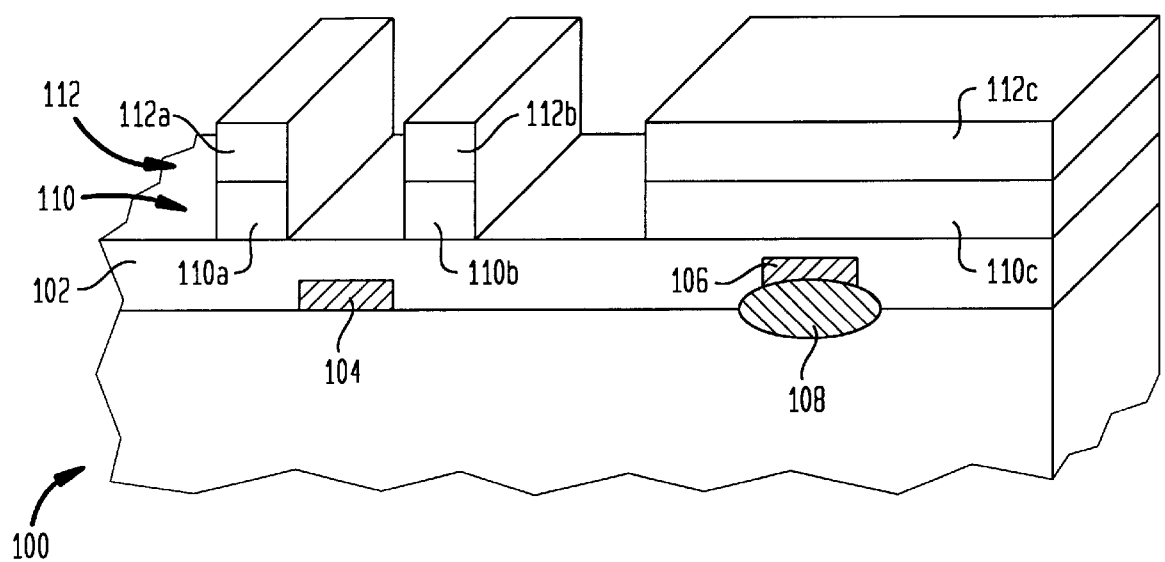

As shown in FIG. 5, the oxide layer 112 and metal layer 110 are patterned to form metal regions 110a, 110b, 110c. Each of the metal regions is covered by a corresponding oxide region 112a, 112b, 112c. The metal regions are, for example, in the form of lines 110a, 110b, and pad 110c.

Typically, the metal lines 110a, 110b, have a width of 0.4~0.8 $\mu$m. The pad 110c illustratively has a width of >5 $\mu$m. The patterning of the metal takes place as follows. First a photolithographic mask is deposited over the oxide layer 112. The oxide is then patterned by using a first etching step to remove portions of the oxide layer exposed through the photolithographic mask. Then the patterned oxide layer is used as an etching mask for the underlying metal layer. The etching material for the oxide is $CHF_3/CF_4$ or $C_2F_6/CHF_3$ chemistry. The etching material for the metal is chlorine chemistry.

Figure 6:
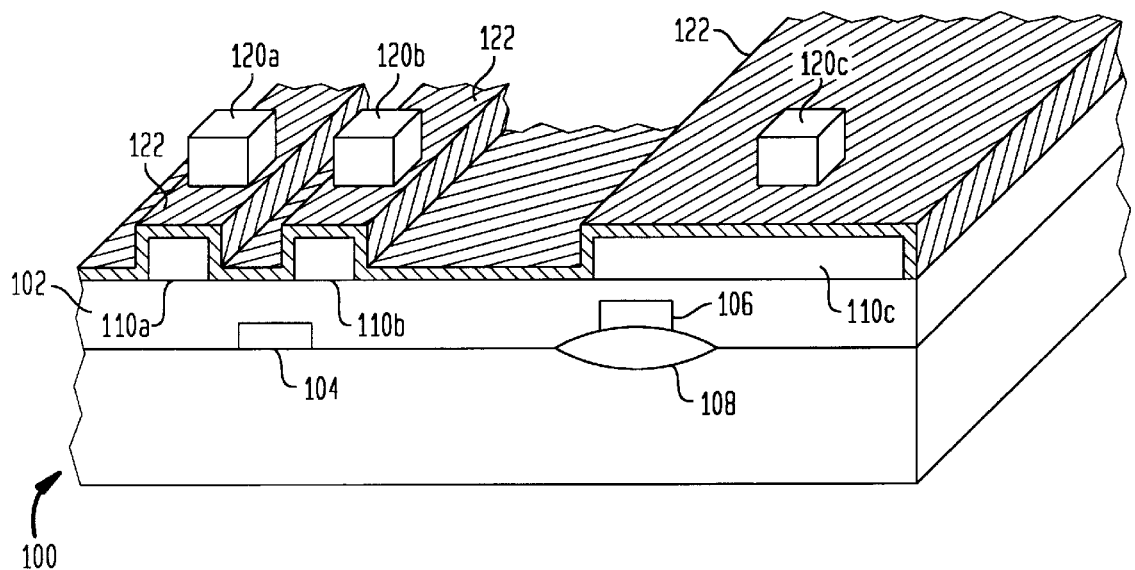

As shown in FIG. 6, the next step is to form oxide islands 120a, 120b, 120c, at selected locations over the metal regions 110a, 110b, 110c. The locations of the islands 120a, 120b, 120c are chosen at locations where it is desirable to form via holes.

The islands 120a, 120b, 120c are formed by first forming a photolithographic mask (e.g., from photoresist) which covers the oxide regions 112a, 112b, 112c where the islands are to be formed. Then the portions of the oxide regions 112a, 112b, 112c not belonging to the islands are removed by etching. Illustratively, the etching material is $CHF_3/CF_4$ or $C_2F_6/CHF_3$ chemistry (F chemstry).

As shown in FIG. 6, an oxide underlayer 122 is then grown on the surface of the structure. The oxide layer 122 is shown by hatching in FIGS. 6, 7, 8, 9, 10, and 11. The oxide layer has a thickness of about 1000 Å and is grown by a PFCVD process.

Figure 7:
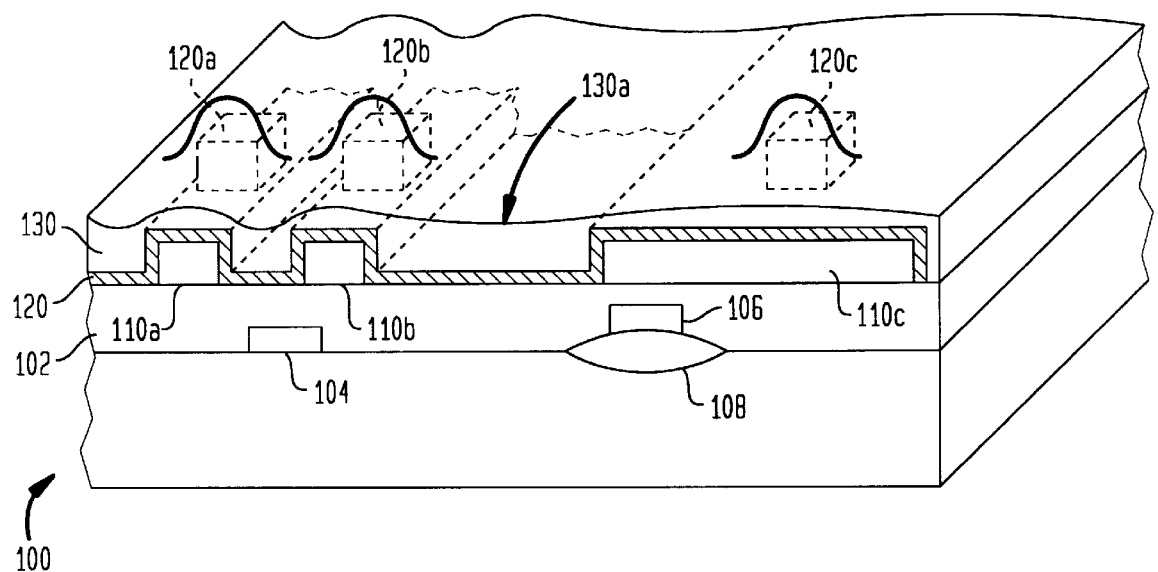

As shown in FIG. 7, the next step is to spin-on a dielectric SOG or low K polymer. An example of a low K polymer is Allied Signal™ 418™ and Hitachi™ HSG™. The spin-on material is designated 130 and its profile is designated 130A in FIG. 7. As shown in FIG. 7, only a thin film of the spin-on material (spin-on dielectric) covers the islands 120a, 120b, 120c. The thickness of the spin-on material above the islands 120 is <2000 Å.

Figure 8:
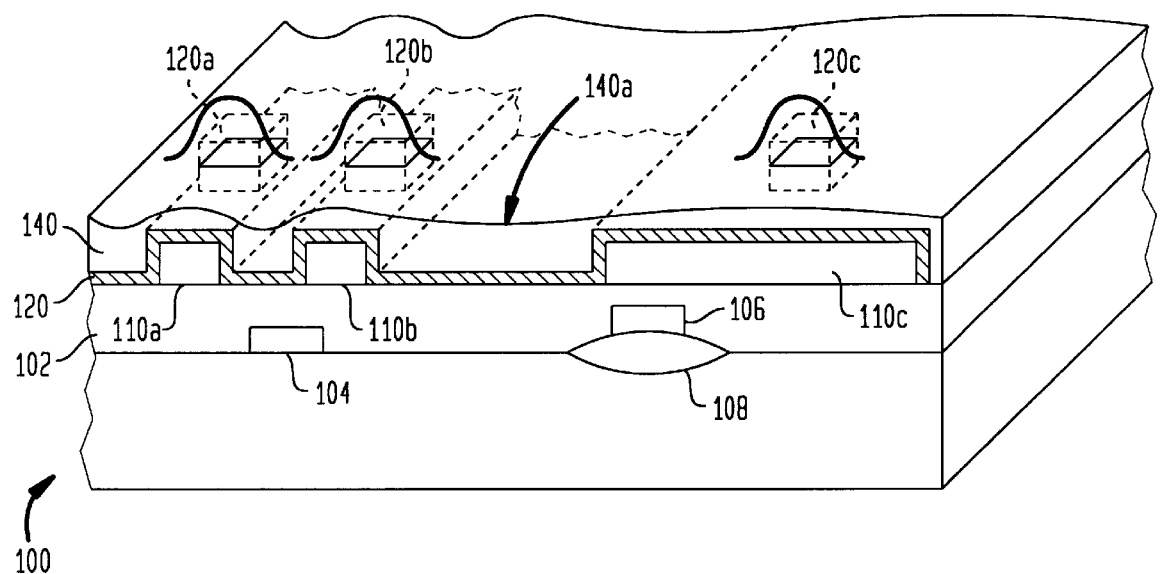

Next as shown in FIG. 8, the spin-on material is partially etched back to remove the spin-on material from the top of the islands 120. The spin-on material (spin-on dielectric) after partial etchback is designated 140 in FIG. 8 and its profile is designated 140A.

Figure 9:
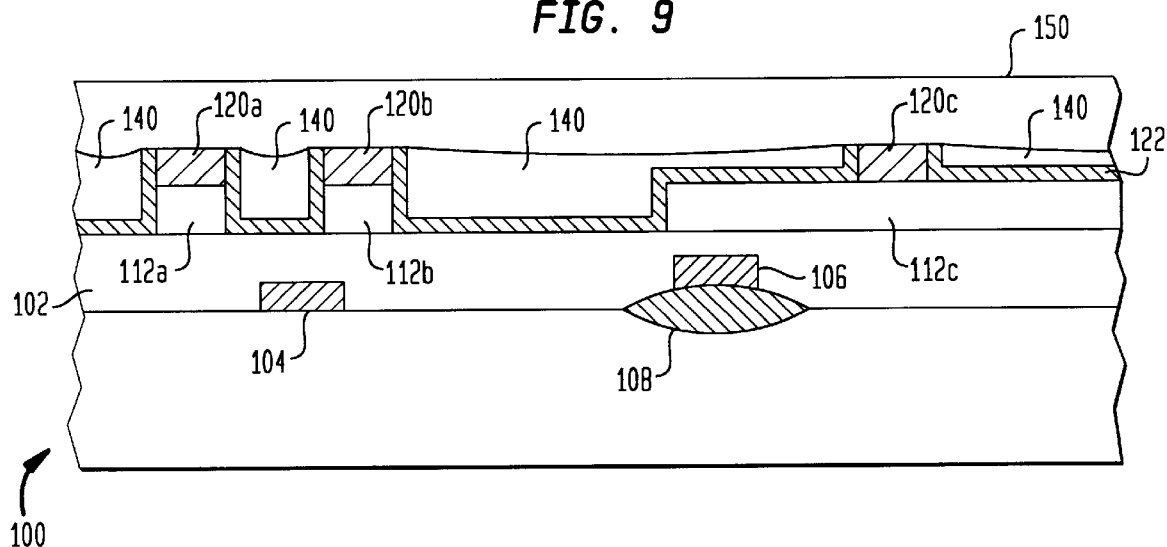
FIGS. 9, 10, and 11 are cross-sectional views illustrating a portion of a process for forming a via hole in accordance with an illustrative embodiment of the invention.

As shown in FIG. 9, the next step is to form a capping oxide layer 150. The capping oxide layer 150 has a thickness of 8000~16000 Å and is formed by a PECVD process. The capping layer is polished using a CMP (Chemical Mechanical Polish) process.

Figure 10:
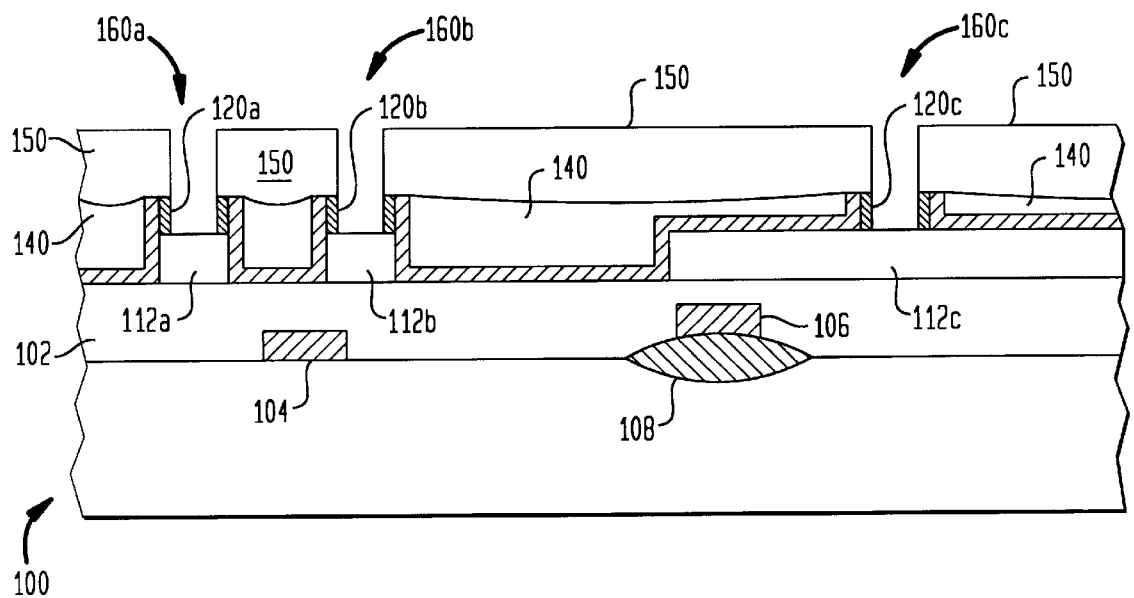

As shown in FIG. 10, the via holes 160a, 160b, 160c are formed through the capping layer 150 and the islands 120a, 120b, 120c. Illustratively, the diameter of the via hole is 0.35–0.60 $\mu$m. The aspect ration of a via hole is approximately 1.5~2.5.

Figure 11:
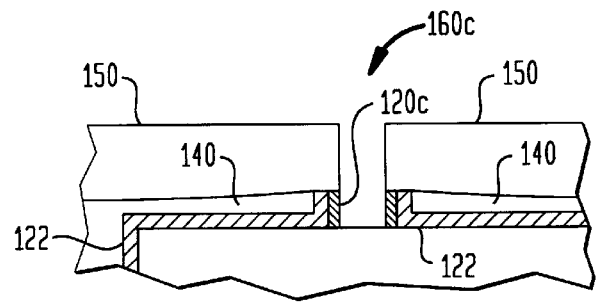

An enlarged view of the via 160C is shown in FIG. 11. As shown in FIG. 11 the sidewalls of the via are coated with a robust oxide formed from the island 120c. According when a W-plug is formed, for example, by diffusion of a W source gas such as $WF_6$, outgassing from the spin-on dielectric 140 (e.g., SOG or low K polymer) is substantially mitigated. The reason is that such outgassing is inhibited by the robust oxide side walls of the via resulting from the island 120c.

Finally, the above described embodiments of the invention are intended to be illustrative only. Numerous alternative embodiments may be devised by those skilled in the art without departing from the spirit and scope of the following claims.

I claim:

1. A method for forming a via hole in an integrated circuit structure comprising the steps of (a) forming a metal layer on a surface of said structure, (b) forming a first oxide layer on said metal layer, (c) patterning said first oxide layer and said metal layer, so as to form patterned metal regions covered by said first oxide, (d) etching said first oxide covering said metal regions, creating one or more islands of said first oxide, (e) forming a second oxide layer, wherein said second oxide layer is thinner than said first oxide layer, and wherein the portions of said structure not covered by said one or more islands is covered by said second oxide layer, (f) spinning onto said structure a gap filling planarization spun-on material, (g) partially etching back said spun-on material removing said spun-on material on top of said one or more islands, (h) forming an oxide capping layer on said structure, and (i) forming a via hole in each of said one or more islands, each of said one or more via holes having sidewalls formed by the first oxide of one of said islands.

2. The method of claim 1 wherein said spun-on material is spun-on-glass (SOG).

3. The method of claim 1 wherein said spun-on material is a low K polymer.

4. The method of claim 1 wherein said first oxide layer is formed using a PECVD process.

5. The method of claim 1 wherein said first oxide layer has a thickness in the range of 3000–5000 Angstroms.

6. The method of claim 1 wherein said capping layer is chemical-mechanical polished (CMP) prior to forming said one or more via holes.

7. A method for forming a metal contact in an integrated circuit structure comprising the steps of (a) depositing a metal layer on the surface of the structures (b) forming an oxide layer on said metal layer, (c) patterning said oxide and metal layers such that oxide islands are formed on said metal layer, (d) spinning on a gap filling planarization spun-on material and partially etching back said spun-on material removing said spun-on material over said oxide islands, (e) forming an oxide capping layer on said structure, (f) forming via holes through said oxide islands, and (g) filling each of said via holes with a tungsten plug.

8. The method of claim 7 wherein said filling step further comprises diffusing tungsten source gas into each of said via holes to form each of said tungsten plugs.

* * * * *